United States Patent
Kim et al.

(10) Patent No.: US 6,882,161 B2
(45) Date of Patent: Apr. 19, 2005

(54) METHOD OF MEASURING DIELECTRIC CONSTANT OF PCB FOR RIMM

(75) Inventors: Young-Woo Kim, Chungchungnam-do (KR); Byoung-Ho Rhee, Daejeon (KR); Dek-Gin Yang, Chungchungbuk-do (KR); Young-Sang Cho, Chungchungbuk-do (KR); Dong-Hwan Lee, Chungchungbuk-do (KR)

(73) Assignee: Samsung Electro-Mechanics Co., Ltd., Kyinggi-Do (KR)

( * ) Notice: Subject to any disclaimer, the term of this patent is extended or adjusted under 35 U.S.C. 154(b) by 0 days.

(21) Appl. No.: 10/447,348

(22) Filed: May 28, 2003

(65) Prior Publication Data

US 2004/0113633 A1 Jun. 17, 2004

(30) Foreign Application Priority Data

Dec. 17, 2002 (KR) ................................ 10-2002-0080850

(51) Int. Cl.[7] ........................ G01R 31/08; G01R 31/11; G01R 37/02
(52) U.S. Cl. ........................ 324/642; 324/533; 324/534; 324/535; 324/639; 324/646
(58) Field of Search ................................ 324/642, 535, 324/639, 646, 537, 527, 533, 534; 716/4

(56) References Cited

U.S. PATENT DOCUMENTS

| | | | | |
|---|---|---|---|---|
| 5,548,483 A | * | 8/1996 | Feldman | 361/737 |
| 5,877,631 A | * | 3/1999 | Takahashi | 324/533 |
| 6,484,299 B1 | * | 11/2002 | Larsen | 716/6 |
| 6,556,306 B1 | * | 4/2003 | Jiang et al. | 356/517 |
| 6,670,816 B1 | * | 12/2003 | Kim et al. | 324/535 |
| 6,759,853 B1 | * | 7/2004 | Butler | 324/534 |

FOREIGN PATENT DOCUMENTS

| | | |
|---|---|---|
| KR | 1019980062554 | 7/2000 |
| KR | 1020000085164 | 7/2002 |

* cited by examiner

*Primary Examiner*—Anjan Deb
*Assistant Examiner*—John Teresinski
(74) *Attorney, Agent, or Firm*—Gottlieb, Rackman & Reisman, PC

(57) ABSTRACT

Disclosed herein is a method of measuring a dielectric constant of a Printed Circuit Board (PCB) for a Rambus Inline Memory Module (RIMM), which includes the steps of measuring a length of a Rambus product of a PCB, applying an input waveform to the Rambus product at a certain probing position and obtaining a cross point of rising times of the input waveform and an output waveform generated by reflection of the input waveform, obtaining time corresponding to the cross point, and calculating a dielectric constant by substituting the measured length of the Rambus product and the obtained time for corresponding variables of a dielectric constant calculating equation.

5 Claims, 8 Drawing Sheets

METHOD OF MEASURING DIELECTRIC CONSTANT OF PCB FOR RIMM

BACKGROUND OF THE INVENTION

1. Field of the Invention

The present invention relates generally to a method of measuring a dielectric constant of a printed circuit board for a Rambus inline memory module, and more particularly to a method of measuring a dielectric constant of a printed circuit board for a Rambus inline memory module in a frequency band of 400 MHz using time domain reflectometry without using a propagation velocity test coupon.

2. Description of the Prior Art

Printed Circuit Boards (PCBs) generally serve to easily connect various electronic devices to each other thereon in certain forms. PCBs are parts widely used in electronic products ranging from home appliances, such as digital televisions, to the newest communication devices. PCBs are classified into multipurpose PCBs, modular PCBs and packaged PCBs.

As electronic products and communication devices recently tend to be light, thin, and small and a Dynamic Random Access Memory (DRAM) market is thriving, the modular PCBs and the packaged PCBs have gained popularity. Additionally, memory manufacturers concentrate their efforts on facility investments and technology research and development to provide for their competitiveness in the DRAM market. Accordingly, PCB manufacturers focus their efforts on technology research and development and the mass production of modular PCBs and packaged PCBs for Rambus DRAMs (RDRAMs) to support the increased marketing of the RDRAMs. Therefore, PCB products are distributed into modular PCBs, Ball Grid Arrays (BGA) and Rambus Inline Memory Module (RIMM).

Meanwhile, modular PCBs equipped with Rambus chips malfunction due to a difference in Time Propagation Delay (TPD) between a data bus and a clock signal at a frequency band of 400 MHz. In this case, the TPD varies with the dielectric constant of a PCB, so it is necessary to measure the dielectric constant of the PCB.

A conventional method of measuring the dielectric constant of a PCB is described with reference to FIGS. 1 to 3 below.

FIG. 1 shows a Propagation Velocity (PV) test coupon used to measure the dielectric constant of a PCB according to the conventional method. FIG. 2 is a graph showing results of probing the PV test coupon using Time Domain Reflectometry (TDR) according to the conventional method. FIG. 3 is a flowchart showing the conventional method of measuring the dielectric constant of a PCB using the PV test coupon.

As shown in FIGS. 1 to 3, a PV test coupon 10 is fabricated in advance as a coupon used to measure the propagation velocity of a medium at step S11. Thereafter, the fabricated PV test coupon 10 is positioned on a work panel and the dielectric constant is measured at step S12.

As shown in FIG. 2, the short trace 21 and long trace 22 of the PV test coupon 10 are probed using the TDR. Thereafter, in order to measure a difference in TPD between positions "A" and "B" of FIG. 2, the TPD value of the position "B" is measured at step S13, and then the TPD value of the position "A" is measured at step S14.

Accordingly, the TPD is calculated by subtracting the TPD value of the position "A" from the TPD value of the position "B" at step 515.

The dielectric constant of the PCB is measured by applying the calculated TPD to a dielectric constant calculation equation (dielectric constant=[TPD×29.981/length]$^2$) at step S16.

In this case, the long trace 22 of the PV test coupon 10 is 280.556 mm, and the short trace 21 thereof is 76.726 mm, so the difference between the two is 203.83 mm.

In the meantime, equipments, measurement conditions, and a test method are described below.

First, a TEK 11801A/B/C model of Tektronics Inc. is used as a digital sampling oscilloscope, and a TEK SD-24 model of Tektronics Inc. is used as a TDR sample head. In this case, a RIMM bare PCB measurement system is used as essential measuring equipment to measure the dielectric constant of a PCB, warm-up is performed for more than forty minutes before the measurement of the dielectric constant.

To obtain a graph shown in FIG. 2, the test conditions for probing a PV test coupon using the TDR are described in Table 1.

TABLE 1

| RISING TIME | MAIN TIME SCALE | VERTICAL SCALE | AVERAGE | CURSOR TYPE |
|---|---|---|---|---|
| 130 ps | 50 ps/div (precision: 1 ps) | 200 mp/div | 32 | paired dots |

Under the test conditions described above, the dielectric constant of a PCB is measured as below.

"A" and "B" shown in FIG. 2 are positions on a time axis.

At the positions, the propagation velocity Vp of a medium is represented as Equation 1, as follows:

$$Vp = \frac{C}{\sqrt{\varepsilon_r}} = \frac{L}{T} \tag{1}$$

where C is the velocity of light, $\varepsilon_r$ is the dielectric constant, L is length and T is time.

Accordingly, the dielectric constant $\varepsilon_r$ is represented as Equation 2, as follows:

$$\varepsilon_r = \left[\frac{T_{long} - T_{short}}{L_{long} - L_{short}} \times C\right]^2 \tag{2}$$

where C is the velocity of light.

Accordingly, the dielectric constant $\varepsilon_r$ is represented as equation 3, as follows:

$$\varepsilon_r = \left[\frac{B - A}{203.83} \times 3 \times 10^2\right]^2 \tag{3}$$

where the unit of B and A is ns.

However, the conventional method of measuring the dielectric constant of the PCB is problematic in that the length of an actual pattern is calculated and then a dielectric constant must be reversely calculated, or the PV test coupon must be manufactured and directly positioned on the work panel, so that the manufacturing efficiency of the PCB is reduced. Additionally, the dielectric constant of a PCB obtained by the conventional method is problematic in that an excessive error occurs between the obtained dielectric constant and a dielectric constant actually measured at a frequency band of 400 MHz.

SUMMARY OF THE INVENTION

Accordingly, the present invention has been made keeping in mind the above problems occurring in the conventional art, and an object of the present invention is to provide a method of measuring a dielectric constant of a PCB for a RIMM, which is capable of measuring the dielectric constant at a frequency band of 400 MHz using TDR without the manufacture of a PV test coupon.

Another object of the present invention is to provide a method of measuring a dielectric constant of a PCB for a RIMM, which is capable of improving the accuracy of a test and shortening the time of the test when measuring the dielectric constant at a frequency band of 400 MHz using TDR.

In order to accomplish the above object, the present invention provides a method of measuring a dielectric constant of a PCB for a RIMM, comprising the steps of measuring a length of a Rambus product of a PCB; applying an input waveform to the Rambus product at a certain probing position and obtaining a cross point of rising times of the input waveform and an output waveform generated by reflection of the input waveform; obtaining time corresponding to the cross point; and calculating a dielectric constant by substituting the measured length of the Rambus product and the obtained time for corresponding variables of a dielectric constant calculating equation.

Preferably, the certain probing position may be a via hole formed at an upper right end of the Rambus product.

Preferably, the dielectric constant calculating equation may be as follows:

$$\varepsilon_r = \left[ \frac{time}{length\ of\ Rambus\ product} \times C \right]^2.$$

Preferably, the cross point may be a cross point of rising time of an actual input waveform, i.e., 35 ps, and rising time of a measured output waveform, i.e., 110 ps.

Preferably, the cross point may be automatically or manually set on test equipment, and may be obtained in terms of time according to characteristic impedance, the test equipment comprising digital sampling oscilloscope, TDR, cable and probe tip.

Preferably, the measured length of the Rambus product may be 101.73 mm.

In accordance with the present invention, since propagation velocity is in proportion to a ratio of the velocity of light to the dielectric constant of a PCB that can be interpreted using a ratio of length to time, the dielectric constant can be obtained by utilizing a Rambus product itself without the manufacture of a conventional PV test coupon, and by calculating characteristic impedance through the reverse calculation of a reflection coefficient using TDR, thus improving the accuracy of a test and shortening the time of the test.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
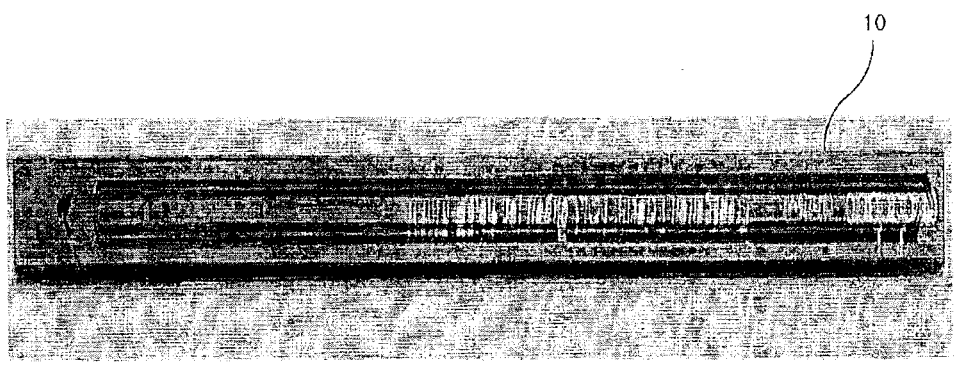
FIG. 1 shows a PV test coupon used to measure the dielectric constant of a PCB according to a conventional method.
Figure 2:
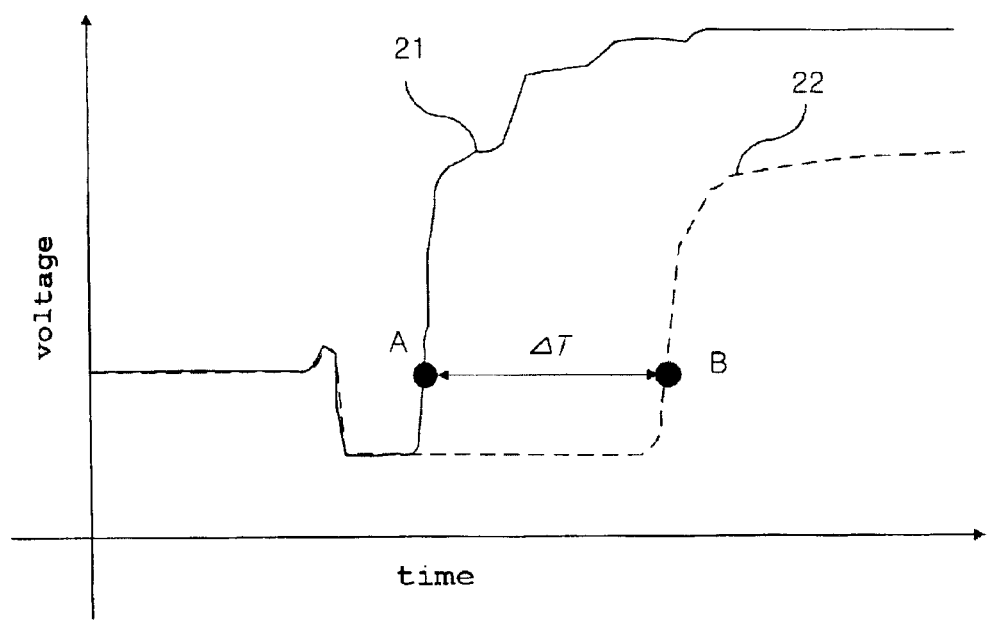
FIG. 2 is a graph showing results of probing the PV test coupon using time domain reflectometry according to the conventional method.
Figure 3:
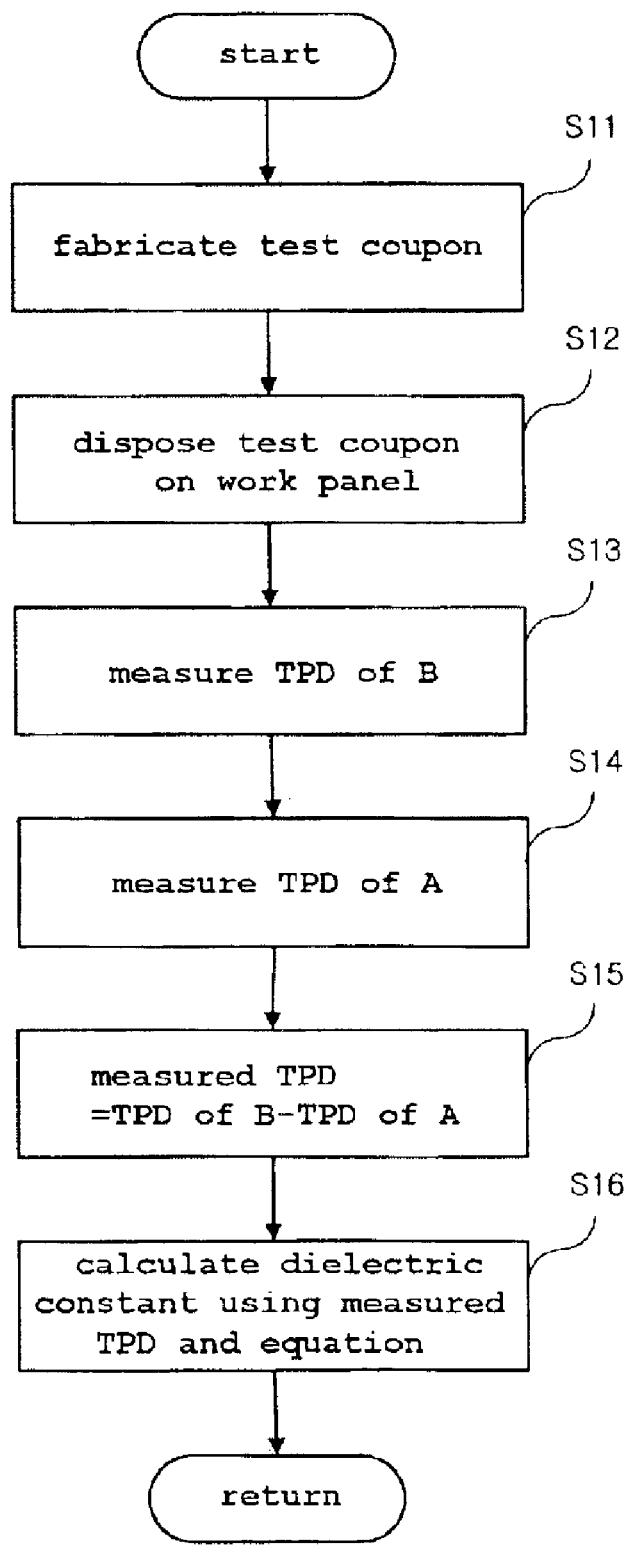
FIG. 3 is a flowchart showing the conventional method of measuring the dielectric constant of a PCB using the PV test coupon.

Reference now should be made to the drawings, in which the same reference numerals are used throughout the different drawings to designate the same or similar components.

With reference to the accompanying drawings, a method of measuring a dielectric constant of a PCB for RIMM in accordance with a preferred embodiment of the present invention is described in detail below.

Figure 4:
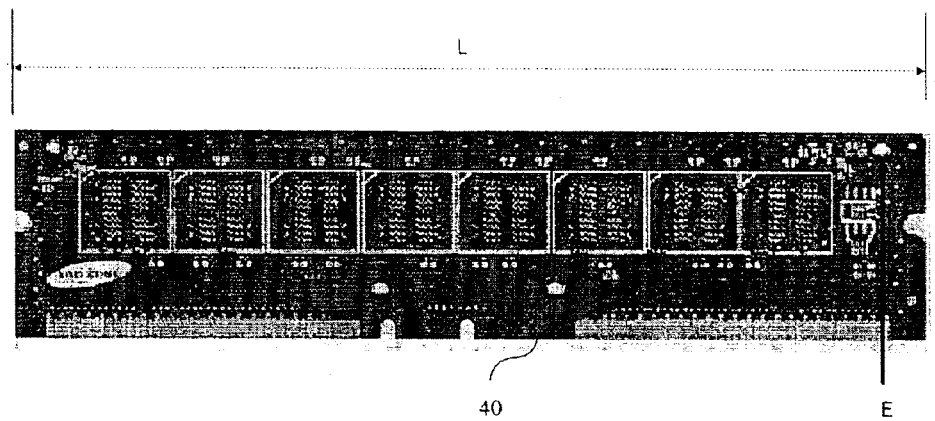
FIG. 4 is a view showing an example of a Rambus product for measuring the dielectric constant of a PCB in accordance with the present invention.

FIG. 4 is a view showing an example of a Rambus product for measuring the dielectric constant of a PCB in accordance with the present invention. A Rambus product 40, for example, a RDRAM, is used instead of a conventional PV test coupon that is separately manufactured.

Such RDRAMs are used in the form of a RIMM in which four to sixteen RDRAMs are assembled in a module. The RIMM provides a high bandwidth through the use of an impedance controllable transmission path, so the high frequency characteristics of component devices, such as a RIMM module and a mother board, that is, impedance, propagation delay, propagation delay skew, etc., should satisfy certain specifications so as to control the electric and logic characteristics of the RIMM. In particular, a RAMBUS channel is operated at a maximum data propagation velocity of hundred million times per minute, so high frequency characters, for example, reflection and cross talk, are very important.

The propagation time of an electric signal satisfies a maximum specification and a minimum specification for a system using the RDRAM to be operated in conformity with logic, so propagation delay is an important characteristic. In this case, the propagation delay of the RIMM is chiefly determined by the wave velocity of a RIMM PCB and the capacitive load of a surface mount type RDRAM. In a general RIMM, delay caused by a PCB occupies 60–90% of the total propagation delay thereof.

The delay caused by a PCB is significantly affected by a prepreg and a core. The RIMM is made of standard FR-4 material, but the careful selection of the material of the RIMM and the optimization of the layered structure of the RIMM must be pursued to implement such electric impedance and propagation delay as to satisfy certain specifications.

Additionally, when a RDRAM is mounted on a PCB, a capacitive load is added to the PCB, so the signal propagation time of wiring or a trace is lengthened. Accordingly, as the degree of the integration of the RIMM is increased, propagation delay caused by the RDRAM is increased. Additionally, when a RDRAM with high input capacitance is used, the impedance of the RIMM is decreased, but propagation delay is increased. That is, in order to maximize a yield of production, the RDRAM and the PCB must be optimized so that the specifications of impedance and propagation delay are satisfied when the RDRAM and the PCB are combined with each other.

To measure propagation delay, the propagation velocity of a signal is measured. In other words, propagation delay caused by a certain structure, that is, propagation velocity, can be obtained by measuring a difference between times required for a pulse to pass through the structure. For specifications related to the propagation time of a signal in the RIMM, there is ΔTPD that represents propagation delay and delay skew between Rambus Signal Levels (RSLs).

A work panel in which a plurality of modular boards or pieces are arranged is prepared for the manufacture of a general PCB. For example, a single work panel includes a total of 30 modular boards. In a memory manufacturing facility, the work panel is cut into individual modular boards.

Influences that the variation of a dielectric constant exerts upon TPD may be classified into two types. That is, the variation of a dielectric constant directly influences TPD by varying propagation velocity on a trace, and influences TPD by varying the impedance of the trace. The actions of the two influences exerted on TPD are represented in opposite ways. For example, when the dielectric constant is decreased, TPD is decreased by the increase of propagation velocity, and simultaneously TPD is increased by the increase of impedance. However, the variation of TPD caused by the variation of propagation velocity is greater than the other. If it is assumed that the variation of a dielectric constant does not vary impedance but simply varies propagation velocity, the variation of TPD is within a range of −13.6~12 ps. However, the influence of the accompanying variation of impedance cancels the influence of the variation of propagation velocity to some extent, so the total variation of TPD is less than the variation of the TPD caused by the variation of propagation velocity.

In the meantime, the characteristics of individual parts and a PCB must be guaranteed so as to control the RIMM, and it is difficult due to a via effect and a bending effect to measure signals for the design of the PCB of the RIMM. The via effect influences ΔTPD more than the effect caused by the bending of the trace. Accordingly, the via effect should be taken into consideration in the design of the RIMM.

Referring to FIG. 4, characteristic impedance is obtained by employing TDR at the upper right end of the Rambus product in consideration of the via effect, and a dielectric constant is obtained according to the obtained characteristic impedance. The reason that the dielectric constant is measured at the upper right end of the Rambus product where a via hole is formed is that the characteristics of this portion influence the entire characteristics of the Rambus product the most. As described above, TDR is a method in which the characteristics of a device are measured by analyzing an output waveform that is returned when a certain waveform is input. In this invention, an input waveform is generated and an output waveform is extracted and analyzed so as to carry out TDR.

The dielectric constant is an expression of the extent to which a material induces electric charge, and is an inherent characteristic of a material. The dielectric constant can be expressed as a relative dielectric constant times the permittivity of Vacuum. The dielectric constant is related to polarization velocity. In general, when alternating signals are applied to a signal line, polarization actively occurs in a dielectric material. In that case, the polarization velocity refers to the velocity at which electrons and positive charges are arranged at positive and negative poles. When the dielectric constant increases, the polarization velocity decreases, insulation is deteriorated, and propagation velocity decreases. Accordingly, a PCB requiring high velocity signal propagation is a dielectric body made of material with a low dielectric constant, so the dielectric constant of the PCB must be controlled depending upon the structure of the PCB.

For a method of measuring such a dielectric constant, there is employed a method using TDR. The method of measuring a dielectric constant using TDR is a method of measuring the dielectric constant of a medium by correlating a ratio of the velocity of an electric wave through the medium to the time during which the electric wave moves, with the actual physical length of the medium, using the TDR module of an digital oscilloscope.

The TDR is used to locate an anomaly on an electric line. In the TDR, an electric pulse, such as a mono pulse or step pulse, is input to one end of an electric line. The electric pulse is propagated along the electric line, and is reflected at a position where characteristic impedance changes due to open circuit and short circuit and fed back to the input end of the electric line. The position where characteristic impedance changes can be detected using the time that elapses from input time to the time when the reflected pulse reaches the input end and the propagation velocity of the electric line. That is, the TDR is the method of measuring the characteristics of a device by analyzing an output waveform fed back when a certain waveform is input. In the TDR, an input waveform is generated and an output waveform is extracted. In this case, when the rising time of a step waveform or pulse is short, high frequency analysis is enabled and the reliability of measurement is increased.

As a result, the method using the TDR is carried out using a difference between an electrical length and a physical length, and correlates propagation velocity proportional to a ratio of the absolute velocity of light to the dielectric constant with a ratio of length to time.

From Maxwell's wave equation, the velocity of an electromagnetic wave through the medium of a lossless propagation line on a uniform plane is calculated as follows:

$$V_p = \sqrt{\frac{1}{\varepsilon\mu}} = \sqrt{\frac{1}{\varepsilon_0\mu_0\varepsilon_r\mu_r}} = 2.997956377\times 10^8 \times \sqrt{\frac{1}{\varepsilon_r\mu_r}} = \frac{C}{\sqrt{\varepsilon_r\mu_r}} \quad (4)$$

where $\varepsilon_0 = 8.854 \times 10^{-12}$ and $\mu_0 = 4\pi \times 10^{-7}$.

Additionally, in accordance with the definition of velocity of classical physics, V(velocity)=L(length)/T(time) where L is the length of a Rambus product and is given as 101.73 mm.

In this case, the time T is determined by the cross point of the rising time of an actual input waveform of Tektronix TDS 800 equipment, i.e., 35 ps, and the rising time of an output waveform reflected, i.e., 110 ps. The method using TDR is performed by calculating characteristic impedance by reversely calculating a reflection coefficient. The total time corresponds to round trip time, so the time to be actually obtained is ½ of the round trip time.

Propagation velocity through a random medium is given as follows:

$$V_p = \frac{C}{\sqrt{\varepsilon_r \mu_r}} = \frac{L}{T} \qquad (5)$$

where the relative permeability of the medium, copper Cu, is 1.

TDR equipment for measuring the dielectric constant of a PCB according to the above-described principal is exemplified as described in table 2.

TABLE 2

| MANU-FACTURER | DIGITAL SAMPLING OSCILLOSCOPE | TDR | CABLE | PROBE TIP |
|---|---|---|---|---|
| Tektronix Inc. | TDS 8000, CSA 80000 11801B,C | 80E04 SD-24 | Tektronix 015-0560-00 | Tektronix 206-0398-00 |

A RIMM bare PCB measuring system is equipped with the above-described components. After the system is warmed up for more than 40 minutes, the system is put to work.

Figure 5:
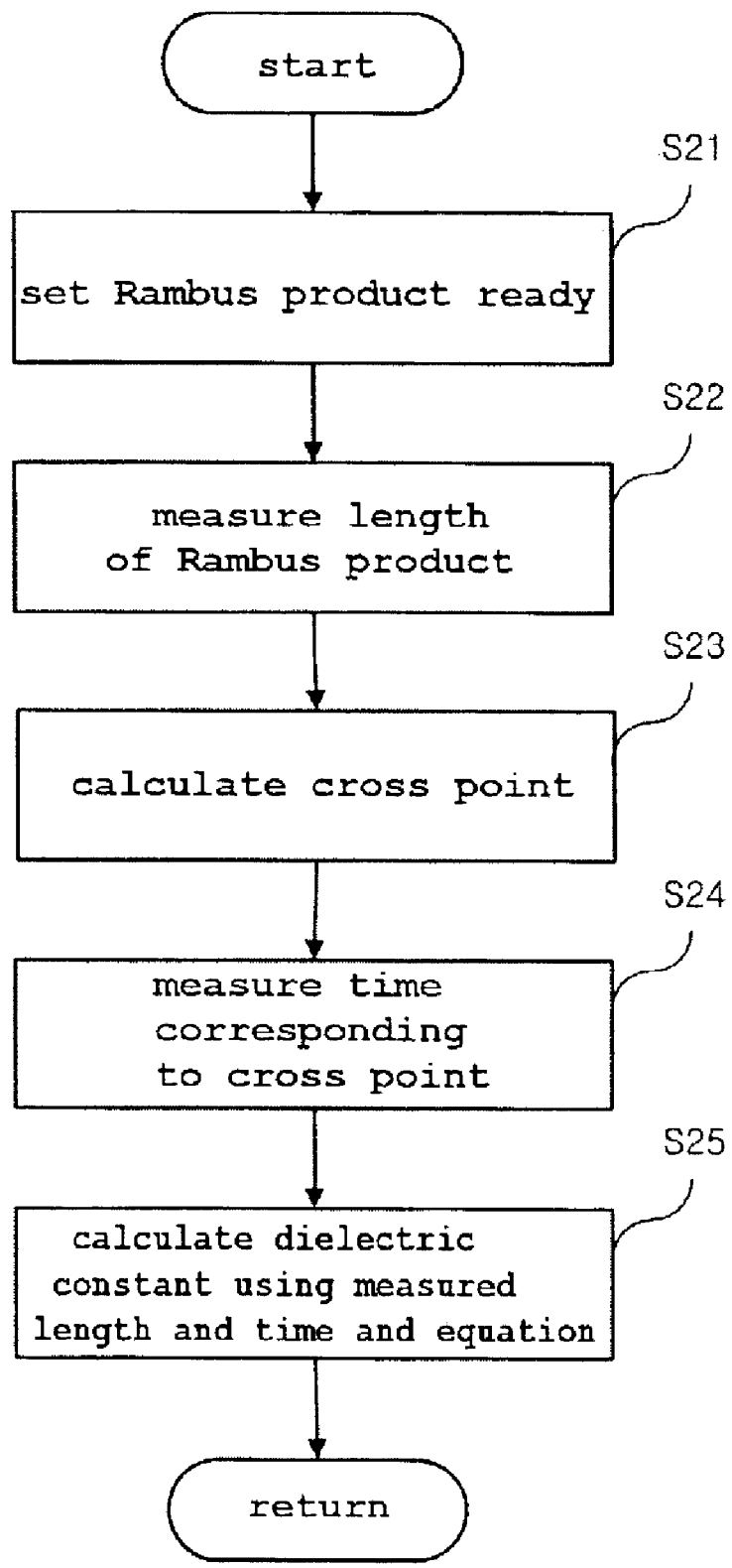
FIG. 5 is a flowchart showing a method of measuring the dielectric constant of a PCB using the characteristic impedance of a Rambus product in accordance with the present invention.
Figure 6:
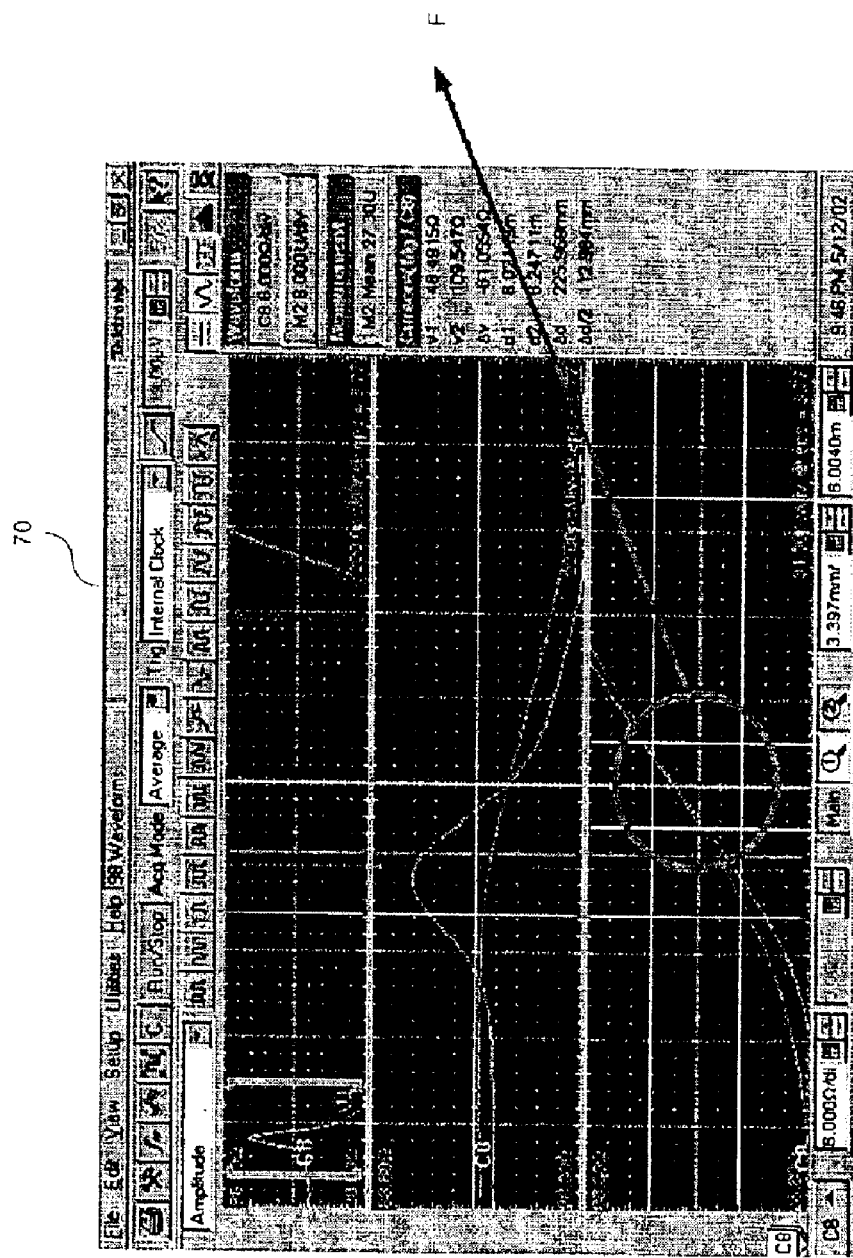
FIG. 6 is a photograph showing the forming of a cross point on a full screen according to the method of the present invention.
Figure 7:
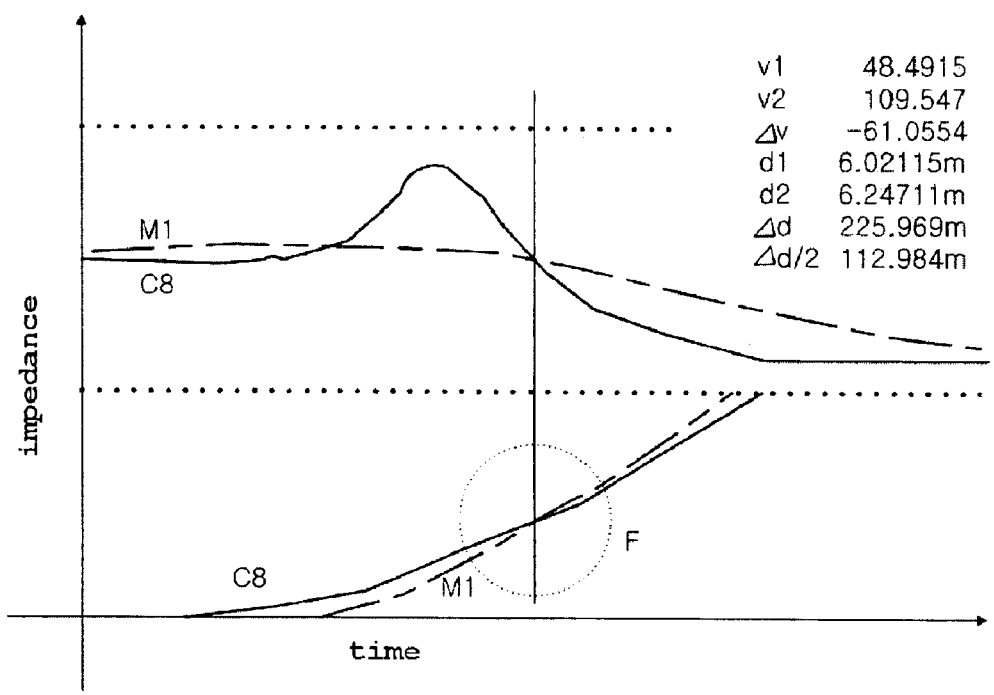
FIG. 7 is a graph clearly illustrating the principle of FIG. 6.

FIG. 5 is a flowchart showing a method of measuring the dielectric constant of a PCB using the characteristic impedance of a Rambus product in accordance with the present invention. FIG. 6 is a photograph showing the forming of a cross point on a full screen according to the method of the present invention. FIG. 7 is a graph clearly illustrating the principle of FIG. 6.

In FIG. 6, the formation of a cross point F is illustrated on a 40~60% portion of the screen. Reference numeral 70 represents the full screen of the measuring equipment.

In more detail, referring to FIG. 7, on the lower portion of the full screen 70, the cross point of input and output waveforms is obtained and the times and impedances thereof are measured. For example, the impedance of the input waveform V1 is 48.4915 Ω, the impedance of the output waveform V2 is 109.547 Ω, and a difference between the impedances of the input and output waveforms ΔV is −61.0554 Ω. Additionally, lengths obtained according to the characteristic impedances are as follows: d1=6.02115 m, d2=6.24711 m, and Δd=225.969 mm. The actual distance Δd/2 is 112.984 mm.

An example of the method of measuring the dielectric constant of a PCB in accordance with the present invention is described below. That is, the detailed process of obtaining the above-described cross point is described below.

First, a Rambus product 40 as shown in FIG. 4 is prepared for the measurement of a dielectric constant of a PCB for a RIMM using the TDR at step S21.

Thereafter, the actual length of the Rambus product is measured at step S22. In this case, the actual length may be the longitudinal length of the Rambus product, e.g., 101.73 mm. At step S23, the cross point of the rising times of input and output waveforms is obtained using the measurement equipment so as to interpret velocity proportional to a ratio of the velocity of light through air to the dielectric constant of a PCB using a ratio of length to time.

In this case, the time corresponding to the cross point is obtained according to characteristic impedance that is calculated by reversely calculating a reflection coefficient by using the TDR. The total time is round trip time, so the time to be actually obtained is ½ of the round trip time.

Figure 8:
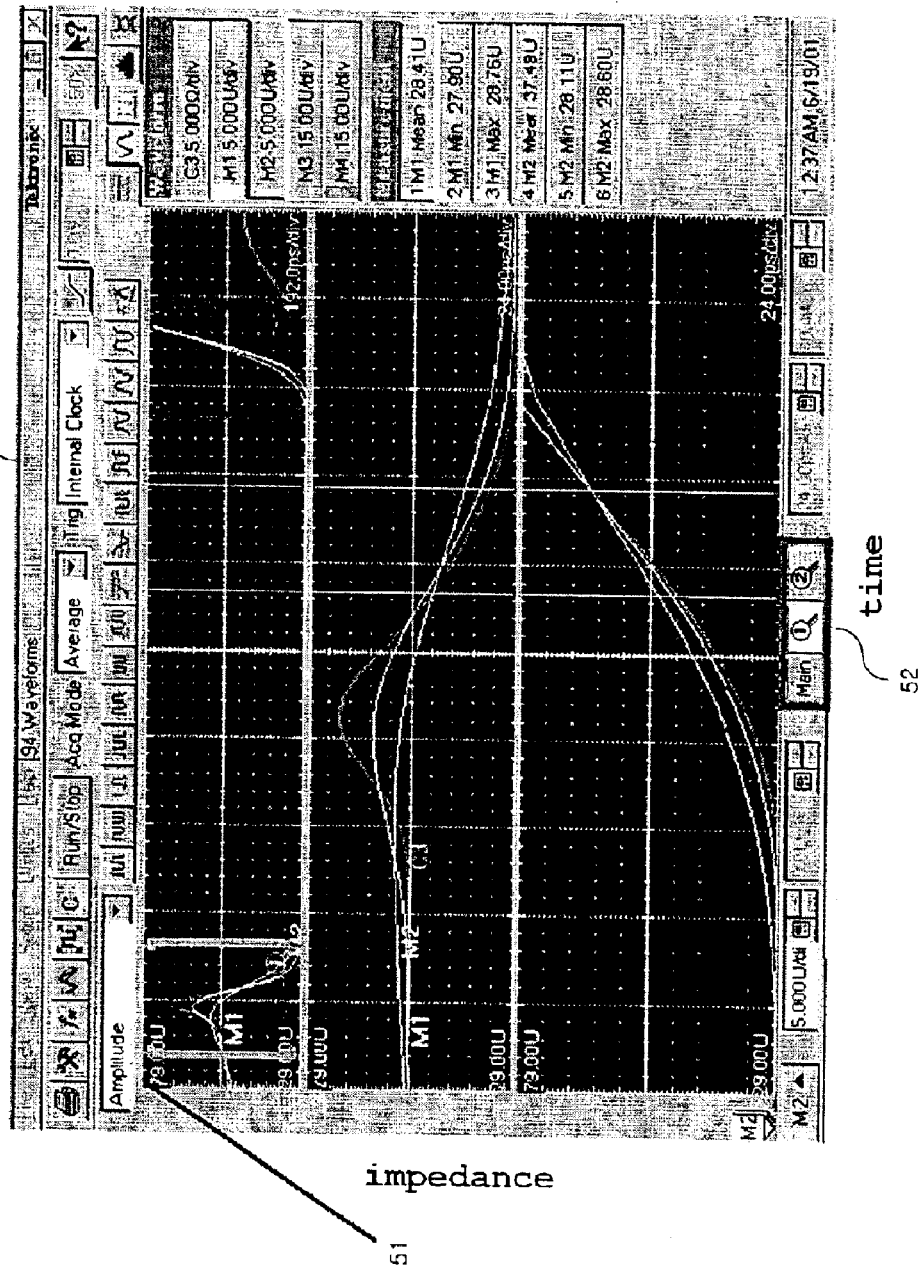
FIG. 8 is a view showing an example of manual and automatic tests according to the present invention.

Referring to FIG. 8, a process of obtaining the cross point in the TDR is performed in the order described as below. However, the order of performance and contents displayed may be different depending upon measurement equipment and a measuring person.

With reference to FIG. 8, the manual and automatic obtainment of the cross point is described.

FIG. 8 is a view showing an example of manual and automatic tests according to the present invention. In this drawing, reference numeral 50 denotes a full screen displayed, reference numeral 51 denotes an amplitude, and reference numeral 52 denotes manipulation buttons that are used to set Main, Mag1 and Mag2. Actually, it is apparent that manipulation buttons and the contents of a screen can be different depending upon the types of measurement equipment. In this embodiment of the present invention, they are described and illustrated as an example.

The process of the manual test is performed as below.

1. The length of a Rambus product is measured, and then the sizes of vertical and horizontal scales are adjusted as shown in table 3. In this case, the horizontal scale can be set to allow right and left intervals.

2. The time base of Mag1 and Mag2 is opened.

3. Main, Mag1 and Mag2 are set with a horizontal reference put at a left side. Conditions are set as described in table 3.

TABLE 3

| | VERTICAL | | HORIZONTAL | | RISING | ACQUISI- |
|---|---|---|---|---|---|---|
| | POSITION | SCALE | POSITION | SCALE | TIME | TION |
| C1 | −10.00 Ω | 5 Ω/div | — | 200 | 17.5 ps (single side) | 64 |
| M1 | −10.00 U | 5 U/div | — | 200 | 110 ps | |

Since the time for which a waveform is stabilized may be lengthened if a test is performed after an average state is set in advance, the average state must be settled after the waveform is stabilized.

4. The position of a front panel is adjusted by setting M1 so that the cross point of a position where a thing falls from an overshoot is centered.

5. The scale of M1 is set to 20~30 Ps using a horizontal scale turn dial.

6. The position of the front panel of M2 is set with the rising cross point of the reflection side of a waveform being centered.

7. On the measurement column of a setup box, G1 is put on the cross point of M1 and G2 is put on the cross point of M2.

8. The values of the cross points of M1 and M2 are read, and calculated using the following Equation 6.

$$\text{time} = \frac{\left[\text{left position of } M2 + A \times \frac{G2}{10}\right] - \left[\text{left posotion of } M1 + A \times \frac{G1}{10}\right]}{2} \qquad (6)$$

9. With reference to the above-described test mechanism, the dielectric constant $\varepsilon_r$ according to the obtained time is reversely calculated and estimated.

The order of the automatic test is described below.

The steps 1 to 6 of the automatic test are the same as those of the manual test, so a detailed description of them is omitted here.

7. On the cursor column of a setup box, a cursor is put on M1, a cursor 2 is put on M2, and an option is put on a waveform.

8. The cursors 1 and 2 are positioned at cross points, respectively.

9. A length is set on the horizontal scale of the setup box, the value of a dielectric constant Dk is increased until ΔT/2 of the cursors 1 and 2 reaches the length of the Rambus product 101.73 mm ±0.1 mm, and the value of a dielectric constant Dk is read when ΔT/2 reaches the length.

In this case, since a precise length is not indicated due to the characteristics of the automatic test, determination is performed using an approximate value and a deviation is ±0.1 mm ±0.05 mm. That is, 0.05 mm is added to the deviation of the Rambus product ±0.1 mm, so a total deviation is in a range of ±0.05 mm.

With reference to FIG. 5, time corresponding to the cross point is obtained using Equation 6 at step S24. The dielectric constant is obtained by substituting the measured physical length and time for the corresponding variables of Equation 5 at step S25.

As a result, in accordance with the present invention, the dielectric constant is measured as described above. The dielectric constant can be obtained by using a Rambus product itself without the manufacture of a conventional PV test coupon, and calculating characteristic impedance through the reverse calculation of a reflection coefficient using TDR.

As described above, the present invention provides a method of measuring a dielectric constant of a printed circuit board for a RIMM, which does not require the manufacture of a PV test coupon to measure the dielectric constant of a PCB, thus improving the manufacturing efficiency of a product. That is, a part can be additionally inserted into the position of a PV test coupon.

Additionally, the measurement of a dielectric constant is enabled using TDR equipment other than a vector network analyzer. The method of the present invention can improve the precision of a test at a frequency of 400 MHz, compared to a conventional method using a PV test coupon. For example, an error range is ±2%.

In addition, measuring time can be shortened because the method of the present invention eliminates the inconvenience of measuring a dielectric constant, compared to a conventional method using a PV test coupon.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of measuring a dielectric constant of a Printed Circuit Board (PCB) for Rambus Inline Memory Module (RIMM), comprising the steps of:

measuring a length of a Rambus product of a PCB;

applying an input waveform to the Rambus product at a certain probing position and obtaining a cross point of rising times of the input waveform and an output waveform generated by reflection of the input waveform;

obtaining time corresponding to the cross point; and calculating a dielectric constant by substituting the measured length of the Rambus product and the obtained time for corresponding variables of a dielectric constant calculating equation.

2. The method according to claim 1, wherein the certain probing position is a via hole formed at an upper right end of the Rambus product.

3. The method according to claim 1, wherein the dielectric constant calculating equation is as follows:

$$\epsilon = [\text{time/length of Rambus product} \times C]^2.$$

4. The method according to claim 1, wherein the cross point is a cross point of rising time of an actual input waveform and rising time of a measured output waveform.

5. The method according to claim 1, wherein the cross point is automatically or manually set on test equipment, and is obtained in terms of time according to characteristic impedance, the test equipment comprising digital sampling oscilloscope, TDR, cable and probe tip.

* * * * *